United States Patent [19]

Schwartz

[11] Patent Number: 5,036,371
[45] Date of Patent: Jul. 30, 1991

[54] MULTIPLE QUANTUM WELL DEVICE

[75] Inventor: Carey Schwartz, Ridgecrest, Calif.

[73] Assignee: The United States of America as represented by the Secretary of the Navy, Washington, D.C.

[21] Appl. No.: 413,025

[22] Filed: Sep. 27, 1989

[51] Int. Cl.$^5$ .................. H01L 29/161; H01L 29/205; H01L 29/225; H01L 27/12

[52] U.S. Cl. ............................... 357/16; 357/4; 357/30; 357/61; 357/85

[58] Field of Search ............... 357/16, 4, 30, 61, 85

[56] References Cited

U.S. PATENT DOCUMENTS

| | | | |
|---|---|---|---|
| 4,137,542 | 1/1979 | Chang et al. | 357/16 |
| 4,163,238 | 7/1979 | Esaki et al. | 357/16 |
| 4,205,331 | 5/1980 | Esaki et al. | 357/30 |
| 4,208,667 | 6/1980 | Chang et al. | 357/16 |
| 4,450,463 | 5/1984 | Chin | 357/4 |
| 4,581,621 | 4/1986 | Reed | 357/16 |
| 4,620,214 | 10/1986 | Margalit et al. | 357/30 |
| 4,806,993 | 2/1989 | Voisin et al. | 357/4 |
| 4,816,878 | 3/1989 | Kano | 357/16 |
| 4,894,526 | 1/1990 | Bethea et al. | 357/30 |
| 4,903,101 | 2/1990 | Maserjian | 357/30 |

OTHER PUBLICATIONS

Anderson, Ph.D., *Modern Physics and Quantum Mechanics*, pp. 174-176, 357* 4.
Sze, *Semiconductor Devices, Physics & Tech.*, pp. 252-255, 357* 30.
Cha et al., "Multiple quantum well 10 um GaAs/Al$_x$-G$_{1-x}$As infrared detector w/improve responsivity," Appl. Phys. Lett. 50(25), 6-22-87, pp. 1814-1816.
Harwit et al., "Observation of Stark Shift in Quantum Well Interband Transitions," Appl. Phys. Lett. 50(11), 3-16-87, pp. 685-687.
Levin et al., "New 10 um infrared detector using intersubband absorption in resonant tunneling GaNAs superlattices," Appl. Phys. Lett. 50(16), Apr. 20, 1987, pp. 1092-1094, 357* 4.
G. H. Döhler, Solid State Superlattice, Nov. 83, pp. 144-151 of Scientific American, 357* 58.
G. H. Döhler, Doping Superlattices, May/Jun. 79, pp. 851-856 of American Vacuum Society, 357* 4.
C. J. Summen, Variable spaced superlattice energy filter, Jan. 23, 1986, American Institute of Physics, 357* 4.

*Primary Examiner*—Andrew J. James
*Assistant Examiner*—Daniel Kim
*Attorney, Agent, or Firm*—Sol Sheinbein; Melvin J. Sliwka; Harvey A. Gilbert

[57] ABSTRACT

A multiple quantum well device having a wide well and a plurality of narrower wells spaced from each other and sandwiched between a plurality of barriers and with quantum coupling existing between the wells. Semiconductor substrates and optimal well and barrier widths are selected to yield band gaps and charge localization within the wells such that the energy differences between the ground state of the wide well and the N excited states of the narrow wells correspond to the energy of a photon in the desired spectral range.

25 Claims, 2 Drawing Sheets

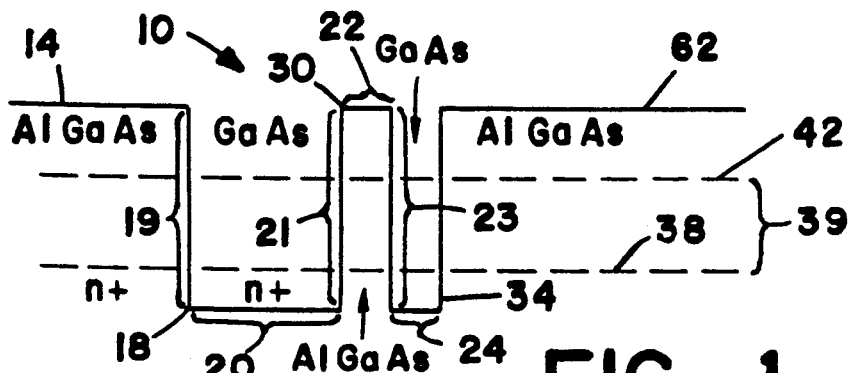
FIG_1
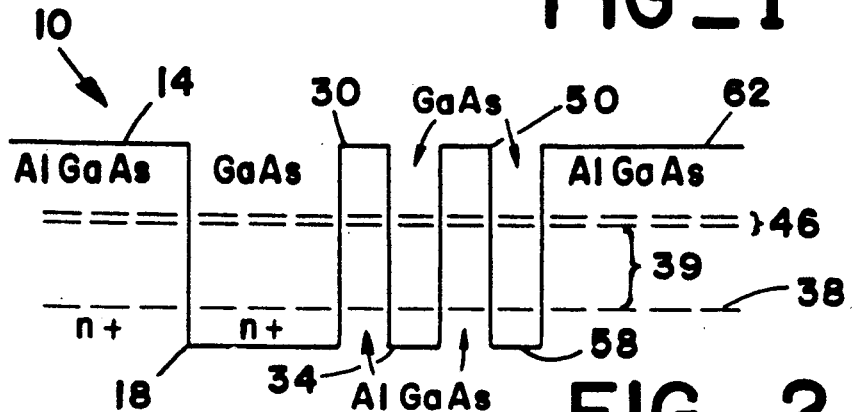
FIG_2
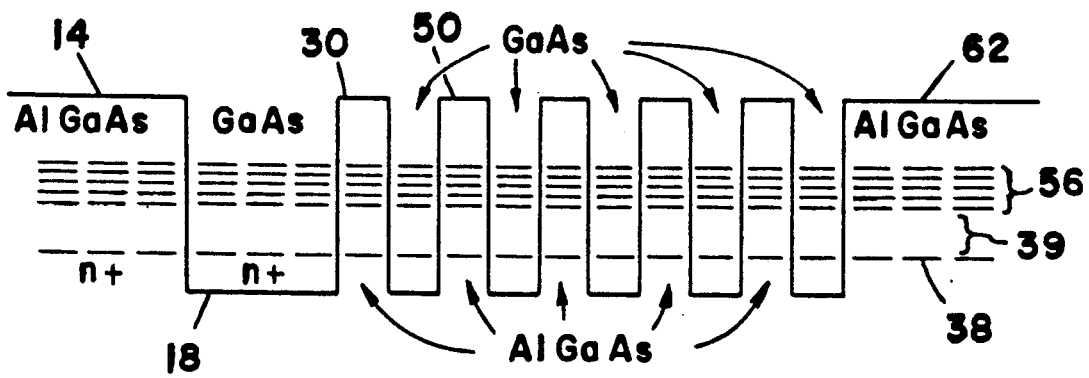
FIG_3
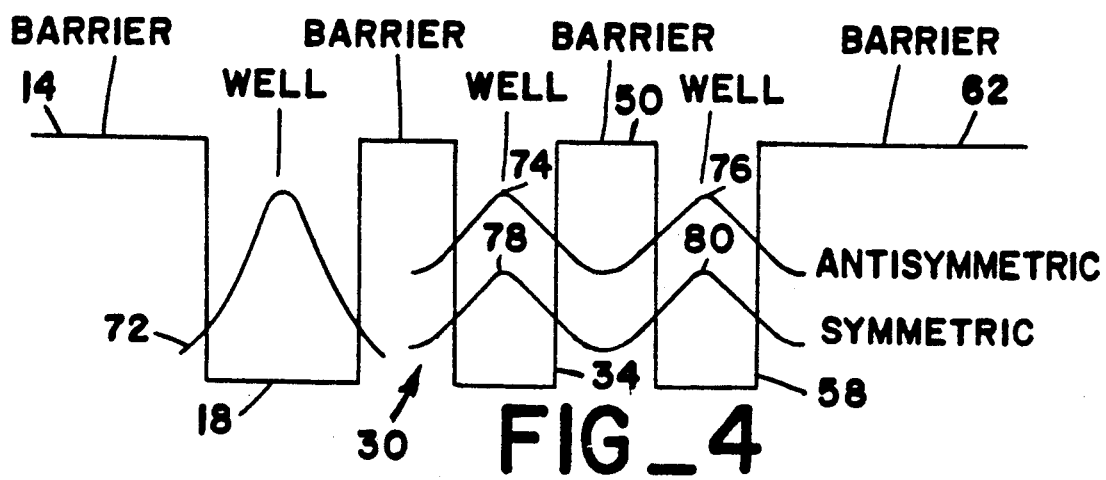
FIG_4

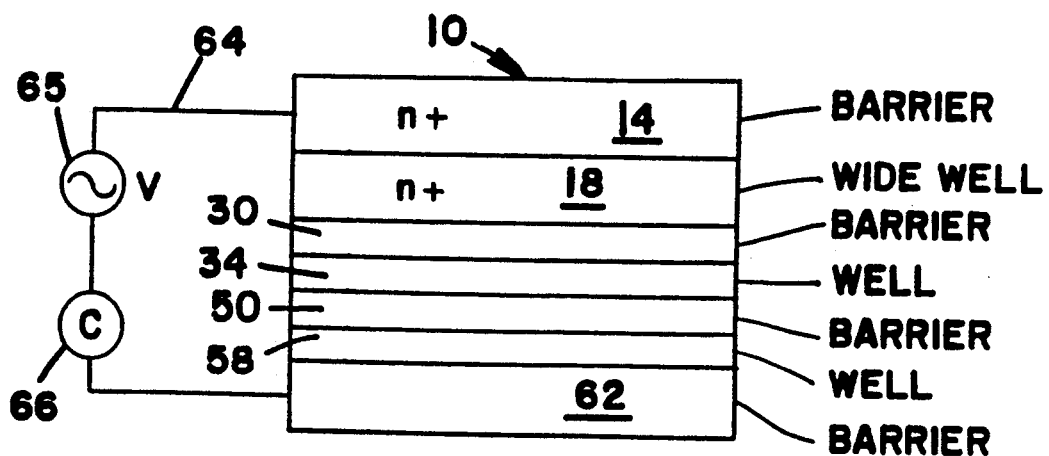
FIG_5
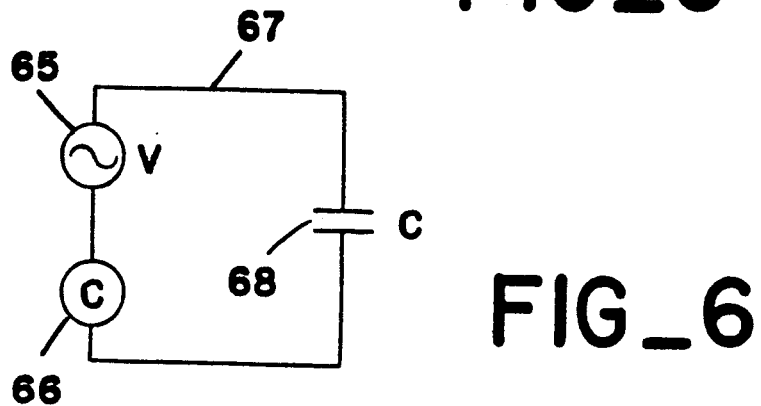
FIG_6
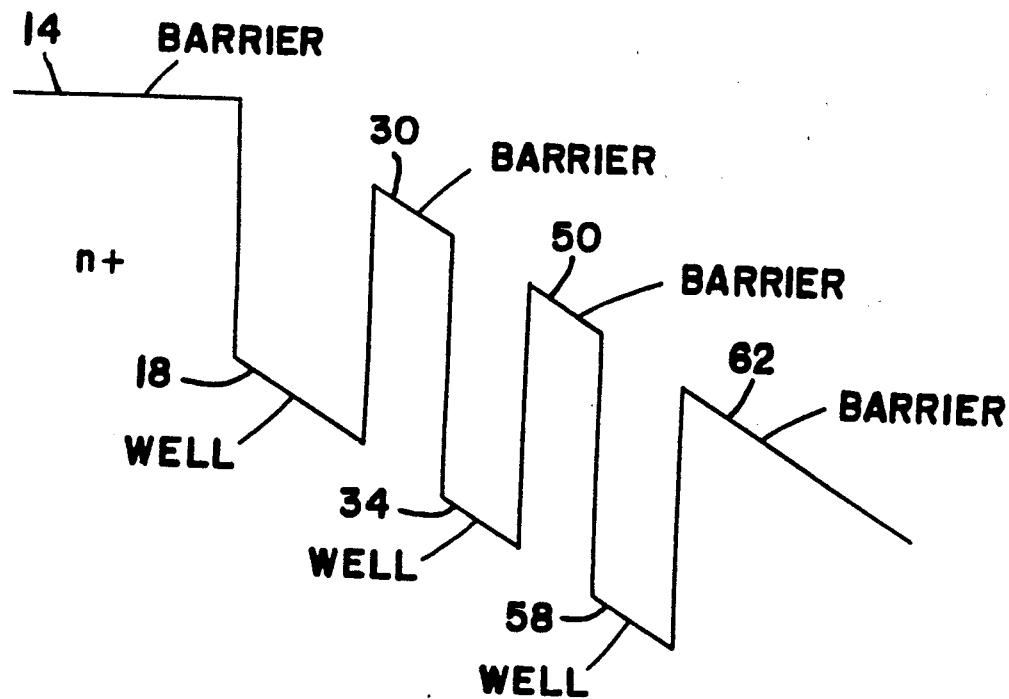
FIG_7

MULTIPLE QUANTUM WELL DEVICE

BACKGROUND OF THE INVENTION

The present invention relates to semiconductor devices and in particular to such devices configured with multiple quantum wells.

Quantum well semiconductors and their fabrication are generally known in the art. Such devices have been prepared with alternating thin layers or structures of high charge carrier mobility and low bandgap material constituting the quantum well charge confinement regions sandwiched between barrier layers or structures of low charge carrier mobility and high bandgap material relative to each other. The quantum well charge confinement regions are sized for thicknesses less than or equal to the deBroglie wavelength for the particular charge carrier of interest. The deBroglie wavelength for a given charge carrier is given by the equation $\lambda = h/mv_t$ where $\lambda$ is the deBrogl wavelength for the particular charge carrier of interest, $v_t$ is the drift velocity of that charge carrier, m is its mass, and h is Planck's constant. In addition to alternate layering of well and barrier layers, appropriately sized three dimensional quantum well structures such as cylinders or irregular-shaped solids can be located with periodic or random spacing within a layer of barrier material. The sizing and spacing of such quantum well structures is, of course, based upon the deBroglie wavelength or wavelengths of the charge carriers of interest. Molecular beam epitaxy is the means by which the ultra-thin layers or structures of the wells, and in particular applications, the barrier layers, are fabricated. Other standard semiconductor growth technologies such as, metal oxide chemical vapor deposition (MOCVD), and atomic layer epitaxy (ALE) can be used.

The prior art devices have typically been prepared for the purpose of creating or exploiting voltage or current effects dependent on charge transfer. An external DC voltage applied in a direction normal to the sandwiched charge-confining layers constituting the quantum wells can be used to rapidly move the charge carriers from one well to an adjoining well and can further be used to cause localization of charge carriers in wells. This, of course, makes such localization voltage dependent in the first instance. Doping by both invasive and non-invasive means can be used either by itself or in conjunction with the application of an external voltage to create localization of charge carriers within particular regions of the wells. Thus, pre-biasing a quantum well device and localization of charge carriers by doping are two approaches in use to predispose the bandgaps to receive particular external energy inputs which will produce device response. However, invasive and permanent introduction of semiconductor or doping structure can be expensive and by virtue of its permanency is unforgiving.

In the specific applications area of infra-red detection several additional issues arise. Infra-red detectors based on semiconductors have a band gap that falls in the infra-red range. The operation of these detectors requires excitation of an electron from the valence band to the conduction band of the semiconductor. The minimum energy required for this transition is the band gap. Thus, semiconductors cannot detect infra-red radiation which corresponds to energies below the band gap, as the technology has evolved during the past thirty years, dopants and compound semiconductors have been used to lower the infra-red detection threshold to the far infra-red. Presently, in the 8 to 12 micron window, devices based on the compound semiconductor mercury cadmium telluride (HgCdTe) are used. These devices suffer from several drawbacks. The precursor compounds used to prepare the devices by such techniques as molecular beam epitaxy (MBE) and metal-organochemical vapor deposition (MOCVD) require high temperatures, for example, greater than 350° C. to dispose the molecules for deposition. This results in the constituents diffusing into the device layers where their presence is highly undesirable, for example, mercury (Hg) diffusion creates an alloy and loss of shelf life. Further, linear grading of the composition causes grading of the band gap decreasing the response of the material. Finally, constituent diffusion causes temperature instability and shortens shelf-life.

The present invention employs growth technologies such as MBE or MOCVD and conventional fabrication techniques for depositing contacts on Group III-V or II-VI semiconductor alloys. Also, the present invention employs charge localization and device response to photon impingement to produce a capacitance change proportional to the photon energy transferred.

OBJECTS

It is an object of the present invention to provide a multiple quantum well semiconductor structure for producing charge carrier localization.

It is another object of the present invention to provide a multiple quantum well semiconductor structure having a bandgap receptive of photons of a particular wavelength.

It is an object of the present invention to provide a multiple quantum well semiconductor device for detecting a photon by observing the capacitance change within the device caused by absorption of that photon.

It is yet another object of the present invention to provide a multiple quantum well device capable of detecting photon radiation at frequencies over a broad spectral band.

It is still another object to the present invention to provide a multiple quantum well device particularly suited to detect infra-red radiation by photon energy transfer caused capacitance change in the device.

SUMMARY OF THE INVENTION

The present invention is a multiple quantum well semiconductor device with a first quantum well located between a first outer barrier and a first inner barrier and having a width greater than the successive and remaining quantum wells sandwiched between inner barriers and the last inner barrier and a second outer barrier. These wells and barriers are structures of semiconductor alloys from Groups III-V or II-VI in the form of flat or concentric cylindrical layers or other multi-dimensional forms. By increasing the number of quantum wells following the wide well, the number of allowed transitions in response to photons of different wavelengths or energy can be increased. This permits the device to be used as a photon activated switch and a binary memory. The potential-well depths are determined by the semiconductor materials used to fabricate the device. This in conjunction with the optimal well and barrier widths including the wider first quantum well establish the structure of the present multiple quantum well invention as one exhibiting the same general features as those of a single quantum well. Thus, the ground state of the wide well is below that of the ground state equivalent of the narrow wells, and is the ground state for the system. The N-fold energy band resulting from the N narrow quantum wells represents the first excited "sub-band states." Additionally, the quantum wells result in wave function localization so that charge density can be measured as an indication of photon energy transfer.

BRIEF DESCRIPTION OF THE DRAWINGS

FIG. 1 is a minimum conduction band diagram of a one wide well and one narrow well structure of the present invention.

FIG. 2 is a minimum conduction band diagram of a one wide well and two narrow well structure of the present invention.

FIG. 3 is a minimum conduction band diagram of a one wide well and five narrow well structure of the present invention.

FIG. 4 is the minimum conduction band diagram of FIG. 2 with overlaying probability distributions associated with the three lowest wave functions.

FIG. 5 is a schematic representation of the present invention.

FIG. 6 is an equivalent circuit of the present invention as schematically represented in FIG. 5.

FIG. 7 is the minimum conduction band diagram of FIG. 2 showing the affect of a bias voltage being applied to the present invention.

DETAILED DESCRIPTION OF THE INVENTION

FIGS. 1, 2, and 3 depict bandgap diagrams for three example embodiments of the present multiple quantum well invention.

FIG. 1 is a bandgap diagram of a multiple quantum well device 10 representative of the present invention. The diagram of FIG. 1 shows the bandgap representation of the physical structures for the first outer barrier 14 immediately adjoining the first quantum well 18. In turn the first quantum well 18 which has a well depth 19 and a well width 20 immediately adjoins the second barrier 30 which has a height 21 and a width 22 and which immediately adjoins the second quantum well 34. The second quantum well 34 has a depth 23 and a width 24 and it immediately adjoins the second outer barrier 62. It should be noted that the width 20 of the first quantum well 18 is noticeably greater than the width 24 of the second quantum well 34. Also shown in FIG. 1 is the ground energy state 38 of the multiple quantum well device 10, the ground energy state 42 of the first narrow well, and the bandgap 39 between them. As shown in FIG. 1, 2, and 3, for purposes of example, the barrier semiconductor material is Aluminum Gallium Arsenide (AlGaAs) and the quantum wells are fabricated from Gallium Arsenide (GaAs).

FIG. 2 is a bandgap diagram for another structural version of the present invention which has three physically spaced but coupled quantum wells, the first quantum well 18 coupling with the second quantum well 34 and the third quantum well 58. The first outer barrier 14 and the second barrier 30 sandwich the first quantum well 18, the second barrier 30 and the third barrier 50 sandwich the second quantum well 34, and the third barrier 50 and the second outer barrier 62 sandwich the third quantum well 58. A single ground energy state 38 of the wide first quantum well 18 is shown in relation to the n-fold band 46 which now contains two excited subband states. The bandgap 39 between the single ground energy state 38 and the n-fold band 46 is also shown in FIG. 2. FIG. 3 is a six well bandgap representation of the multiple quantum well device 10 exemplifying the present invention. Again the wells are sandwiched by barriers in the diagrams and are representative of well and barrier structures combined in the fabrication of the present invention. The first wide quantum well 18 contributes the ground energy state 38 and each of the five narrow wells contributes an excited subband state to the five-fold band 56, the difference between the ground energy state 38 of the device, which is the same as that of the wide first quantum well 18, and the 5-fold band being the bandgap 39.

The squared wave function 72 in the first quantum well 18, the antisymmetric squared wave function 74 and 76 in the second quantum well 34 and the third quantum well 58 respectively, and the symmetric squared wave function 78 and 80 in the second quantum well 34 and the third quantum well 58, respectively, are shown in FIG. 4. The squared wave functions represent the probability of finding a charge carrier at various positions in the wells for the three lowest energy states in the wells for the three well version of the present invention. Thus, in the ground state, the charge carrier is located only in the first quantum well 18, the wide well and the second and third energy states are localized in the second quantum well 34 and the third quantum well 58, the narrow wells, and are not found in the wide first quantum well 18. The correlation of the present multiple quantum well invention with a single well device is thus observed in FIG. 4 when considered in light of the fact that the ground state energy of a single quantum well is inversely proportional to the square of the well width. Thus, a very wide well will have a low ground state energy, and a narrow well has a relatively higher ground state energy for the same parameters. The number of allowed energy states in a well is, of course, a function of the width of the well and the potential depth of the well. The exact value of the well depth, which is identical to the conduction band offset depends on the pair of semiconductor materials selected for the well and adjoining barriers. Thus, for a basic single well device, once the semiconductor materials are selected, well and barrier widths become the controlling factors affecting energy states and charge locations in the well, until multiple wells are considered and the affects of well interaction become important factors.

A three well physical embodiment of the multiple quantum well (MQW) device 10 of the present invention is shown in FIG. 5. The multiple quantum well (MQW) device 10 is shown as a stack of planar layers consisting of a first outer barrier 14, the wide quantum well 18 sandwiched between the first outer barrier 14 and the narrower second barrier 30. The second well 34 is sandwiched between the second barrier 30, and third barrier 50, and the third quantum well 58 is sandwiched between the third barrier 50 and the second outer barrier 62. Although not shown in FIG. 5 there are cladding layers which may be deposited on the first outer barrier 14 and the second outer barrier 62. These cladding layers permit the leads of the external circuit 64 to be affixed to the multiple quantum well (MQW) device 10 by soldering or other means. Small conductive leads may be deposited on the two outer barrier layers to permit direct attachment of leads by soldering. The external circuit 64 for the three well embodiment shown in FIG. 5 consists of the voltage source 65 and $C_i$ the inherent capacitance 66 of the device 10. The inherent capacitance 66 is a function of the rest or steady state charge carrier condition of the device 10 which in turn depends on their type, number, and location within the wells of the device.

FIG. 6 is the equivalent circuit for the combined multiple quantum well (MQW) device 10 and the external circuit 64 shown in FIG. 5. The voltage source 65 is connected in series with the steady state or inherent capacitance 66 of the multiple quantum well (MQW) device 10, when all the charge carriers are in the wide well, and in series with the change in capacitance 68 of the multiple quantum well (MQW) device 10 as a result of the impingement of and absorption of energy from a photon having the appropriate energy.

FIG. 7 is a bandgap diagram for a three well multiple quantum well device embodiment of the present invention having a first quantum well coupled to two successive coupled narrow wells where the device is subjected to the application of a voltage source. The conduction band shown in FIG. 7 can be made to vary from zero to the level of energy introduced by the voltage source. When the energy level introduced by the voltage source is the same as the quantum level in the first well tunneling will occur. The voltage source can be a bias voltage to which applications voltages may be added. Thus, in addition to doping of the first outer barrier 14 or the wide first quantum well 18 or both, to predispose localization of charge carriers and energy bands in the invention, a bias voltage may be applied as in FIG. 5 to adjust the energy bands in the coupled wells so as to control where and when tunneling will occur.

OPERATION

The operation of the first-wide well multiple quantum well (MQW) device 10 of the present invention can be best described with reference to FIG. 5. The device 10 is initially in the ground state which may be with or without an applied bias from the voltage source 65. While the device 10 is in the ground state the inherent capacitance $(C_i)$66 is determined. This capacitance reflects the affects of the materials used to fabricate the device 10, the well configurations and dimensions, and the ground state locations of the charge carriers in the wells. The device 10 is next illuminated with appropriate wavelength photons. The capacitance of the device 10 will change by an amount C at 68 in FIG. 6 if the multiple quantum well device 10 transition energy matches that of the incident photon. The change in capacitance C 68 is thus directly a measure of the photon energy and the overall new capacitance of the device which corresponds to the ground state inherent capacitance $C_i$ 66 plus the change in capacitance C 68 constitutes a transition state for the device. Multiple transition states can, of course, be designed by increasing the number of narrow wells coupling to the single wide well. Thus a device 10 having five narrow wells as in FIG. 3 would have five possible transitions.

After the initial change of state of the first wide well multiple quantum well device 10, it can be shielded from further photon impingement. A new voltage source V at 65 can be applied to reverse the transition by driving the charge carriers back to the wide well and, thus, reestablishing the rest state of the device.

It can thus be seen that by quantum coupling the appropriate number of narrow wells to the one wide well to produce charge carrier localization within the device structure and further controlling photon access to the device 10, a device having one or more transition states can be fabricated for such uses as an optical binary memory and switching applications. The device 10 as described herein has particularly valuable uses in the infra-red range. Other applications in other parts of the spectrum are possible.

It should be obvious that further changes and modifications can be made in the invention without departing from its spirit. The invention, however, should not be taken to be limited except by the scope of the claims which follow.

What I now claim as my invention is:

1. A multiple quantum well device, comprising:
    a plurality of spaced barrier structures including a first and second outer barrier structure and at least one inner barrier structure, there-between;
    first quantum well means, sandwiched between said first outer barrier structure and inner barrier structure and operatively associated with said barrier structures, for localizing charge carriers within said device to establish the ground energy state of said device;
    a second quantum well means, separated from, narrower than, and quantum coupled to said first quantum well means, and operatively associated with said barrier structures for localizing charge carriers within said device to establish energy levels comprising an energy band above said ground energy state; and
    means affixed to said device for connecting it to an electrical circuit.

2. The multiple quantum well device of claim 1 wherein said first quantum well means is sandwiched between said first outer barrier structure and inner barrier structure, and is wider than said second quantum well means with which it quantum couples.

3. The multiple quantum well device of claim 2 wherein said second quantum well means comprises a plurality of narrow, spaced quantum well structures each of which is sandwiched between and in contact with one pair of barrier structures.

4. The multiple quantum well device of claim 3 wherein said first quantum well means comprises a single wide quantum well structure having a width greater than the width of any of narrow well structures comprising said second quantum well means, said single wide quantum well structure being disposed between either said first or second outer barrier structure and the next adjacent inner barrier structure.

5. The multiple quantum well device of claim 4 wherein said wide quantum well structure is from 2 times to 5 times as wide as said narrow well structures.

6. The multiple quantum well device of claim 4 wherein said first or said second outer barrier structure is comprised of a wide band gap semiconductor relative to the well regions.

7. The multiple quantum well device of claim 6 wherein said wide quantum well is comprised of a narrow bandgap semiconductor relative to barrier region.

8. The multiple quantum well device of claim 7 wherein said quantum well structures are comprised of narrow bandgap semiconductor and said barrier structures are comprised of wide band gap semiconductor material relative to well regions.

9. The multiple quantum well device of claim 4 wherein said wide quantum well structure is doped.

10. The multiple quantum well device of claim 4 wherein said first outer barrier structure or said second outer barrier structure is doped depending on which is sandwiching said wide well structure with the next adjacent inner barrier structure.

11. The multiple quantum well device of claim 4 wherein said wide quantum well structure and either said first or said second outer barrier structure is doped depending on which of said first or second outer barrier structures is sandwiching said wide well structure with said next adjacent inner barrier structure.

12. The multiple quantum well device of claim 9 wherein said dopant for said wide quantum well structure is silicon donor material.

13. The multiple quantum well device of claim 10 wherein said dopant for said first or said second outer barrier structure is a silicon donor material.

14. The multiple quantum well device of claim 11 wherein said dopant is a silicon donor material.

15. The multiple quantum well device of claim 11 wherein said quantum well structures are planar-shaped layers.

16. The multiple quantum well device of claim 11 wherein said barrier structures are planar-shaped layers.

17. The multiple quantum well device of claim 11 wherein both said quantum well structures and said barrier structures are planar-shaped layers.

18. The multiple quantum well device of claim 1 wherein said means for connecting said device to an electrical circuit is a pair of electrical leads, one end of one lead connected to said first outer barrier structure and one end of the other lead of said pair connected to said second outer barrier structure.

19. A multiple quantum well device, comprising:
a plurality of spaced barrier structures including a first and second outer barrier structure and at least one inner barrier structure therebetween;
a plurality of spaced, quantum well structures each of which is sandwiched between a pair of said barrier structures and in contact therewith, the quantum well structure between one or the other of the first or second outer barrier structure and the next successive barrier structure comprising the sandwich being wider than the remaining quantum well structures all of said well structures being quantum coupled to each other and in operative association therewith; and a pair of electrical leads for connecting said device to an electrical circuit one end of one lead connected to said first outer barrier structure and one end of the other lead of said pair connected to said second outer barrier structure.

20. A multiple quantum well device comprising:
a plurality of spaced stacked barrier layers including a first and second outer barrier layer and at least one inner barrier layer therebetween;
one wide well layer sandwiched between and in contact with said first outer barrier layer and the side of said inner barrier layer facing said first outer barrier layer;
one narrow well layer sandwiched between and in contact with said second outer barrier layer and the side of said inner barrier layer facing said second outer barrier layer; and
a pair of electrical leads, one of which connects said first outer barrier layer to one side of an external circuit and the other side of which connects said second outer barrier layer to the other side of said external circuit.

21. A multiple quantum well device comprising:
a plurality of spaced, stacked barrier layers of wide bandgap semiconductor, said stacked barrier layers including a first and a second outer barrier layer and at least one inner barrier layer therebetween:
one wide well layer of narrow bandgap semiconductor sandwiched between and in contact with said first outer barrier layer and the side of said inner barrier layer facing said first outer barrier layer;
one narrow well layer of narrow bandgap semiconductor sandwiched between and in contact with said second outer barrier layer and the side of said inner barrier layer facing said second outer barrier layer; and
a pair of electrical leads, one of which connects said first outer barrier layer to one side of an external circuit and the other of which connects said second outer barrier layer to the other side of said external circuit.

22. The device of claims 1, or 19, or 20, or 21 wherein said device is photon switched by absorbed photons having wavelengths corresponding to the energy minibands.

23. The device of claims 1, or 19, or 20, or 21 wherein said device is used as a binary memory.

24. The device of claims 1, or 19, or 20, or 21 wherein said device is used as a photon activated switch.

25. The device of claim 22 wherein the photon absorption causes a change in device capacitance corresponding to the energy of the absorbed photon.

* * * * *